US010497490B2

(12) United States Patent
Johnson et al.

(10) Patent No.: US 10,497,490 B2
(45) Date of Patent: Dec. 3, 2019

(54) VARIABLE-LENGTH CONDUCTOR SYSTEM

(71) Applicant: EMC IP Holding Company, LLC, Hopkinton, MA (US)

(72) Inventors: Keith C. Johnson, Medway, MA (US); Joseph P. King, Jr., Sterling, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/895,580

(22) Filed: Feb. 13, 2018

(65) Prior Publication Data

US 2019/0252093 A1  Aug. 15, 2019

(51) Int. Cl.
*H01B 7/06* (2006.01)
*H05K 7/14* (2006.01)

(52) U.S. Cl.
CPC ............ *H01B 7/06* (2013.01); *H05K 7/1488* (2013.01)

(58) Field of Classification Search
CPC ............ H02G 3/08; H02G 3/081; H02G 5/00; H02G 5/06; H02G 5/005; H02G 5/025; H05K 5/00; H05K 5/02; H05K 5/0069; H05K 7/1432; H05K 2201/10272; H05K 7/00; H05K 7/06; H05K 7/1488; H01B 1/026; H01B 7/06; H01B 1/00; H02B 1/20; H02B 1/22; H02B 1/00; H02B 1/012; H01R 13/53; H01R 13/533; H01R 25/16; H01R 25/161
USPC ........... 174/50, 520, 71 B, 68.2, 88 B, 70 B, 174/99 B, 541, 528, 69; 439/76.1, 76.2, 439/212; 361/600, 601, 624, 637, 648, 361/679.01, 775
See application file for complete search history.

(56) References Cited

U.S. PATENT DOCUMENTS

| | | | | | |
|---|---|---|---|---|---|
| 6,381,122 | B2 * | 4/2002 | Wagener | ................ | H02G 5/025 174/71 B |
| 6,489,567 | B2 * | 12/2002 | Zachrai | .................. | H02G 5/025 174/70 B |
| 6,870,103 | B1 * | 3/2005 | Wiant | .................... | H02G 5/007 174/68.2 |
| 6,888,066 | B1 * | 5/2005 | Wiant | ...................... | H02B 1/21 174/68.2 |
| 7,381,889 | B2 * | 6/2008 | Hara | ................... | B60R 16/0238 174/50 |
| 7,799,991 | B1 * | 9/2010 | Advey | ............... | H01R 13/5213 174/50 |
| 8,289,680 | B2 * | 10/2012 | Keegan | ................ | H05K 7/1432 174/68.2 |
| 8,379,374 | B2 * | 2/2013 | Keegan | ................ | H01R 25/142 174/68.2 |
| 8,456,807 | B2 * | 6/2013 | Tallam | ................ | H01F 41/0213 174/68.2 |

* cited by examiner

*Primary Examiner* — Angel R Estrada
(74) *Attorney, Agent, or Firm* — Brian J. Colandreo; Mark H. Whittenberger; Holland & Knight LLP

(57) ABSTRACT

A variable-length conductor assembly is configured for use within an IT component. The variable-length conductor assembly includes a bus bar assembly including at least one bus bar conductor. A sled assembly is configured to be longitudinal-displaceable along the bus bar assembly. The sled assembly includes at least one sled conductor slidably electrically-coupled to the at least one bus bar conductor.

18 Claims, 8 Drawing Sheets

VARIABLE-LENGTH CONDUCTOR SYSTEM

TECHNICAL FIELD

This disclosure relates to variable length conductor systems and, more particularly while not exclusive to, to variable length conductor systems for use within IT devices.

BACKGROUND

In today's IT infrastructure, high availability coupled with high density and small size is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, such systems may be densely packed, wherein many subsystems/components may be included within one enclosure. Accordingly and as would be expected, space within these enclosures is at a premium, while the removal of heat from these systems is of paramount importance.

SUMMARY OF DISCLOSURE

In one implementation, a variable-length conductor assembly is configured for use within an IT component. The variable-length conductor assembly includes a bus bar assembly including at least one bus bar conductor. A sled assembly is configured to be longitudinal-displaceable along the bus bar assembly. The sled assembly includes at least one sled conductor slidably electrically-coupled to the at least one bus bar conductor.

One or more of the following features may be included. The at least one bus bar conductor may include a line voltage bus bar conductor and a neutral bus bar conductor. The at least one sled conductor may include a line voltage sled conductor and a neutral sled conductor. The bus bar assembly may be configured to be electrically-coupled to a power distribution unit. The power distribution unit may include at least one discrete power supply. The sled assembly may be configured to be electrically-coupled to a slidable portion of the IT component. The slidable portion of the IT component may include a system board. The IT component may include a rack-mountable, hyper-converged computing device. The variable-length conductor assembly may be configured to provide electrical power to one or more sub-components included within the IT component. At least a portion of the at least one bus bar conductor included within the bus bar assembly may be plated with an oxidation-resistant material. At least a portion of the at least one sled conductor included within the sled assembly may be plated with an oxidation-resistant material. The at least one sled conductor included within the sled assembly may include at least one biasing element configured to effectuate the slidable electrical coupling of the at least one sled conductor and the at least one bus bar conductor.

In another implementation, a variable-length conductor assembly is configured for use within an IT component. The variable-length conductor assembly includes a bus bar assembly including at least one bus bar conductor. The at least one bus bar conductor includes a line voltage bus bar conductor and a neutral bus bar conductor. A sled assembly is configured to be longitudinal-displaceable along the bus bar assembly. The sled assembly includes at least one sled conductor slidably electrically-coupled to the at least one bus bar conductor. The at least one sled conductor includes a line voltage sled conductor and a neutral sled conductor.

One or more of the following features may be included. The bus bar assembly may be configured to be electrically-coupled to a power distribution unit. The power distribution unit may include at least one discrete power supply. The sled assembly may be configured to be electrically-coupled to a slidable portion of the IT component. The slidable portion of the IT component may include a system board. The IT component may include a rack-mountable, hyper-converged computing device.

In another implementation, a variable-length conductor assembly is configured for use within an IT component. The variable-length conductor assembly includes a bus bar assembly including at least one bus bar conductor. The at least one bus bar conductor includes a line voltage bus bar conductor and a neutral bus bar conductor. A sled assembly is configured to be longitudinal-displaceable along the bus bar assembly. The sled assembly includes at least one sled conductor slidably electrically-coupled to the at least one bus bar conductor. The at least one sled conductor includes a line voltage sled conductor and a neutral sled conductor. The at least one sled conductor included within the sled assembly includes at least one biasing element configured to effectuate the slidable electrical coupling of the at least one sled conductor and the at least one bus bar conductor.

One or more of the following features may be included. The IT component may include a rack-mountable, hyper-converged computing device.

The details of one or more implementations are set forth in the accompanying drawings and the description below. Other features and advantages will become apparent from the description, the drawings, and the claims.

BRIEF DESCRIPTION OF THE DRAWINGS

FIG. 2A is a front view of the rack-mountable computing device of FIG. 2;

Like reference symbols in the various drawings indicate like elements.

DETAILED DESCRIPTION OF THE PREFERRED EMBODIMENTS

Figure 1:
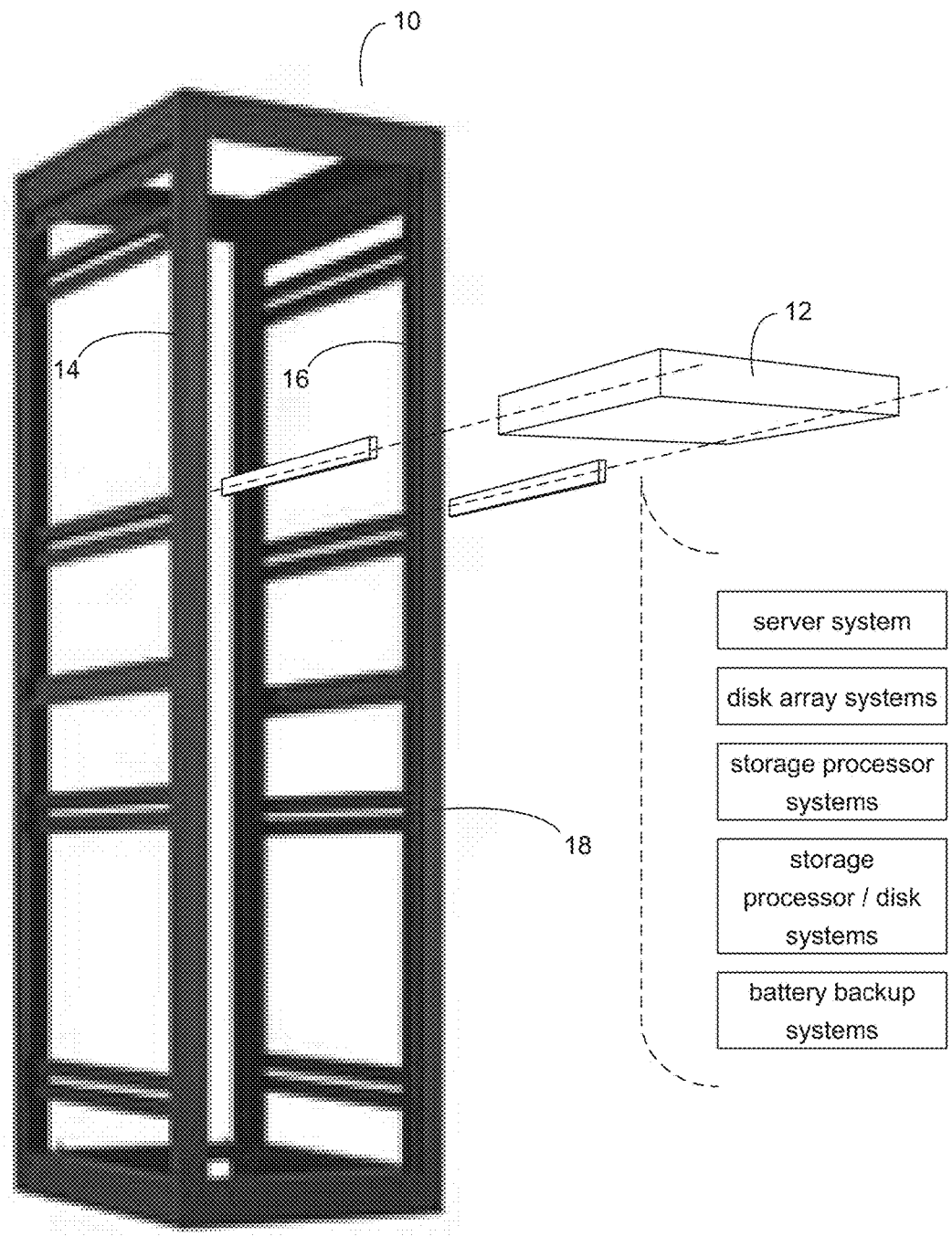
FIG. 1 is a perspective view of an IT rack and an IT component.

Referring to FIG. 1, IT racks (e.g., IT rack 10) may be utilized to store and organize IT components. For example, IT rack 10 may be placed within a computer room and various IT components (e.g., IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components that are configured to fit within IT rack 10 may be described as rack-mountable IT components.

Examples of the various IT components (e.g., IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components within IT rack 10. By standardizing the spacing between NEMA rails 14, 16, the various IT components that fit within a first IT rack may also fit within a second IT rack.

Typically, IT racks are defined in accordance with the number of rack units (U's) included within the rack. For example, a 1 U IT component is half as high as a 2 U IT component, which is half as high as a 4 U IT component. Accordingly, while the number of rack units available within a particular IT rack may be rigidly defined by the size of the IT rack, the number of IT components mountable within that IT rack may vary depending upon the size (in rack units) of the particular IT components being mounted within that IT rack. Therefore, by reducing the number of rack units that a particular IT component uses within an IT rack, additional IT computing devices may be mounted within the IT rack.

Figure 2:
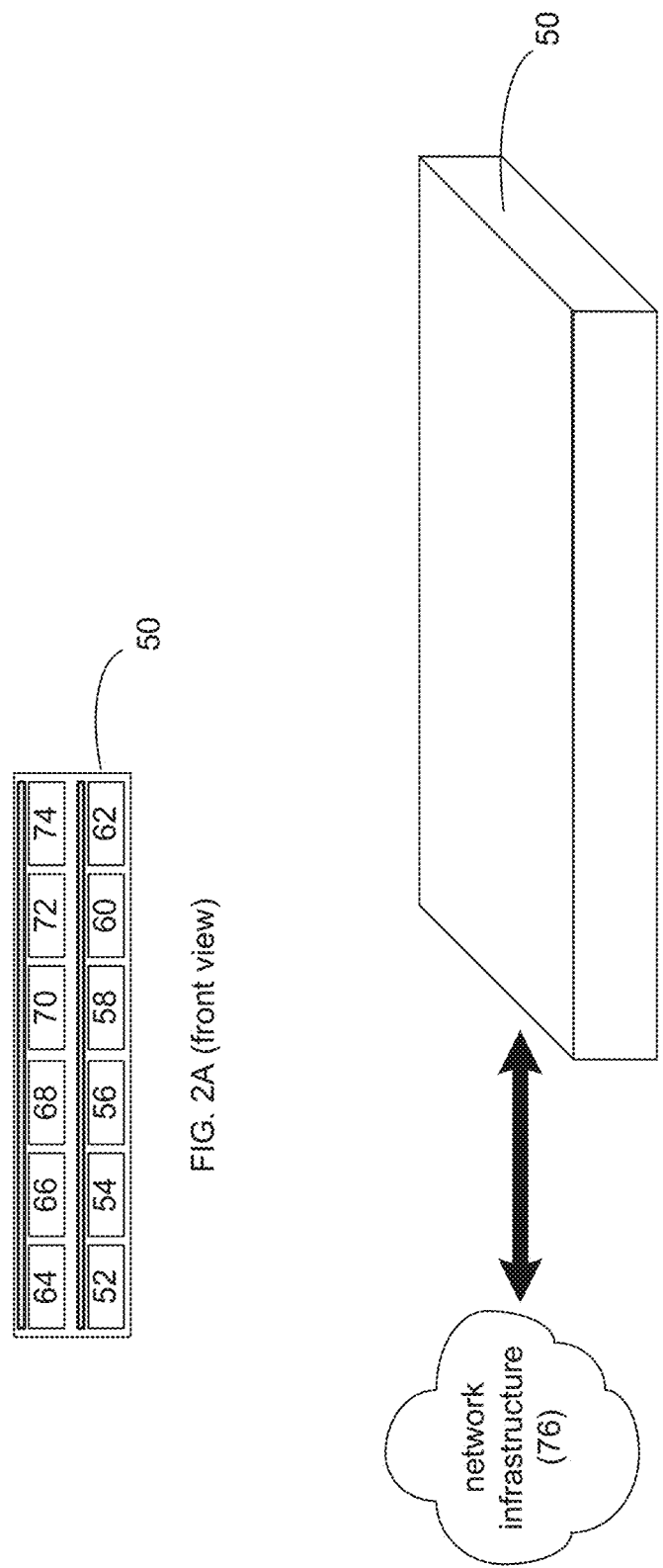
FIG. 2 is a diagrammatic view of a rack-mountable computing device for use within the IT rack of FIG. 1.

Referring to FIG. 2, there is shown one example of IT component 12, namely rack-mountable computing device 50. In this particular embodiment, rack-mountable computing device 50 may include a plurality of individual components, examples of which may include but are not limited to storage components, input/output components, and processing components, any of which may be a field replaceable unit (FRU) that is serviceable in the field.

Storage components may be the portion of rack-mountable computing device 50 that is configured to store data. Examples of such data may include but are not limited to data that is generated remotely (e.g., by applications that are executed on remote devices) or data that is generated locally (e.g., by applications that are executed on rack-mountable computing device 50). Accordingly, the storage component may be configured to include one or more storage devices, examples of which may include but are not limited to one or more rotating-media disk drives (e.g., SATA drives or SCSI drives) and/or one or more solid state storage devices (e.g., flash drives). For example and as shown in FIG. 2A, the storage component of rack-mountable computing device 50 may be configured to include (in this example) twelve 2.5 inch form factor storage devices (e.g., storage devices 52, 54, 56, 58, 60, 62, 64, 66, 68, 70, 72, 74).

The input/output components of rack-mountable computing device 50 may be the portion of rack-mountable computing device 50 that is configured to couple rack-mountable computing device 50 to a network infrastructure (e.g., network infrastructure 76), wherein network infrastructure 76 may be configured to couple rack-mountable computing device 50 to other rack-mountable computing devices, other IT components (e.g., server systems, disk array systems, storage processor systems, storage processor/disk systems, and battery backup systems), other networking devices (e.g., switches, routers, bridges, wireless access points), and/or end user computing devices (e.g., desktop computers, laptop computers, notebook computers, smartphones, tablet computers, etc.). Examples of network infrastructure 76 may include but are not limited to an Ethernet infrastructure; a fiber channel infrastructure; and an Infiniband infrastructure.

The processing components of rack-mountable computing device 50 may be the portion of rack-mountable computing device 50 that is configured to process data, such as data that is generated remotely (e.g., by applications that are executed on remote devices) or data that is generated locally (e.g., by applications that are executed on rack-mountable computing device 50). Accordingly, the processing components of rack-mountable computing device 50 may be configured to include one or more microprocessors.

Figure 3:
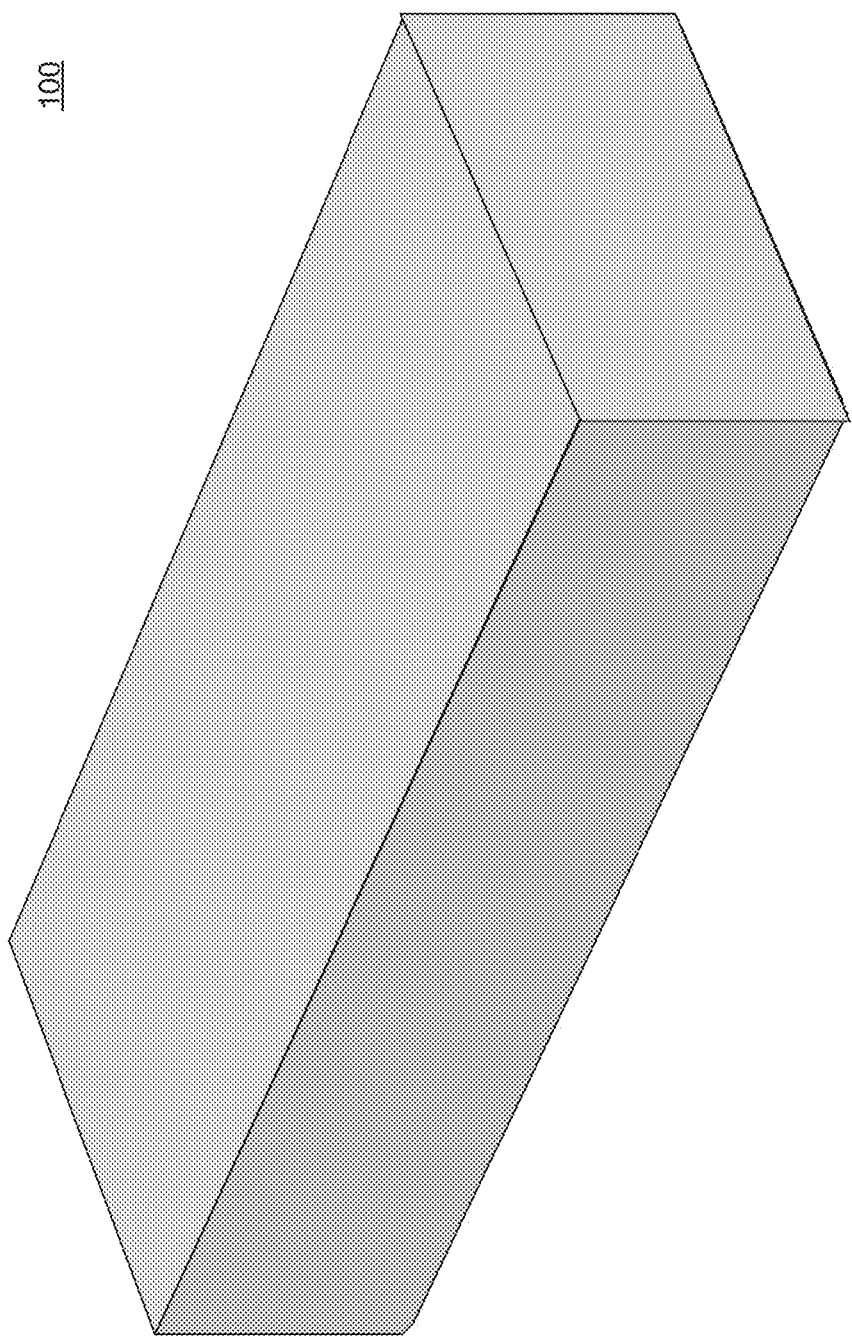
FIGS. 3-5 are diagrammatic views of a rack-mountable, hyper-converged computing device according to an aspect of this disclosure.

Referring also to FIG. 3, there is shown another example of IT component 12, namely rack-mountable, hyper-converged computing device 100. As is known in the art, hyper-convergence is a type of infrastructure system with a software-centric architecture that tightly integrates compute, storage, networking and virtualization resources and other technologies in a commodity hardware box supported by a single vendor. A hyper-converged system allows the integrated technologies to be managed as a single system through a common toolset. Hyper-converged systems may be expanded through the addition of nodes to the base unit.

Figure 4:
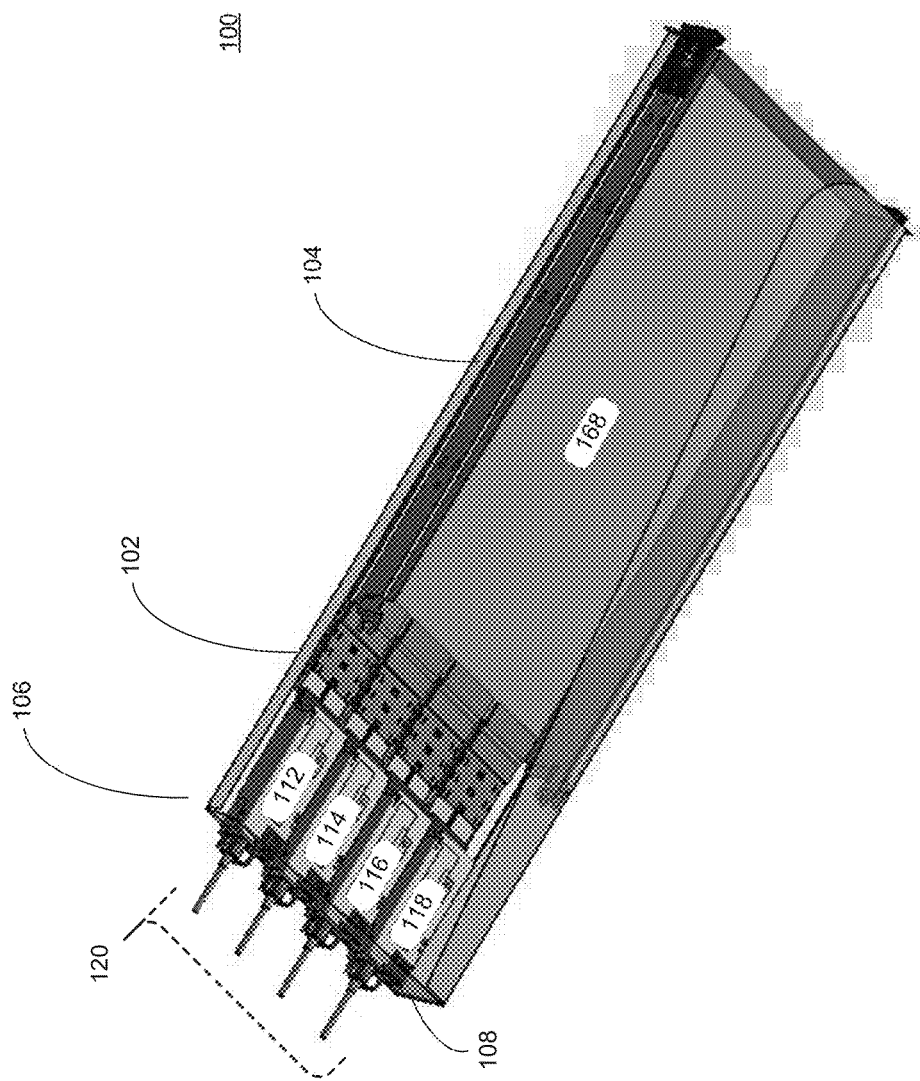
Figure 5:
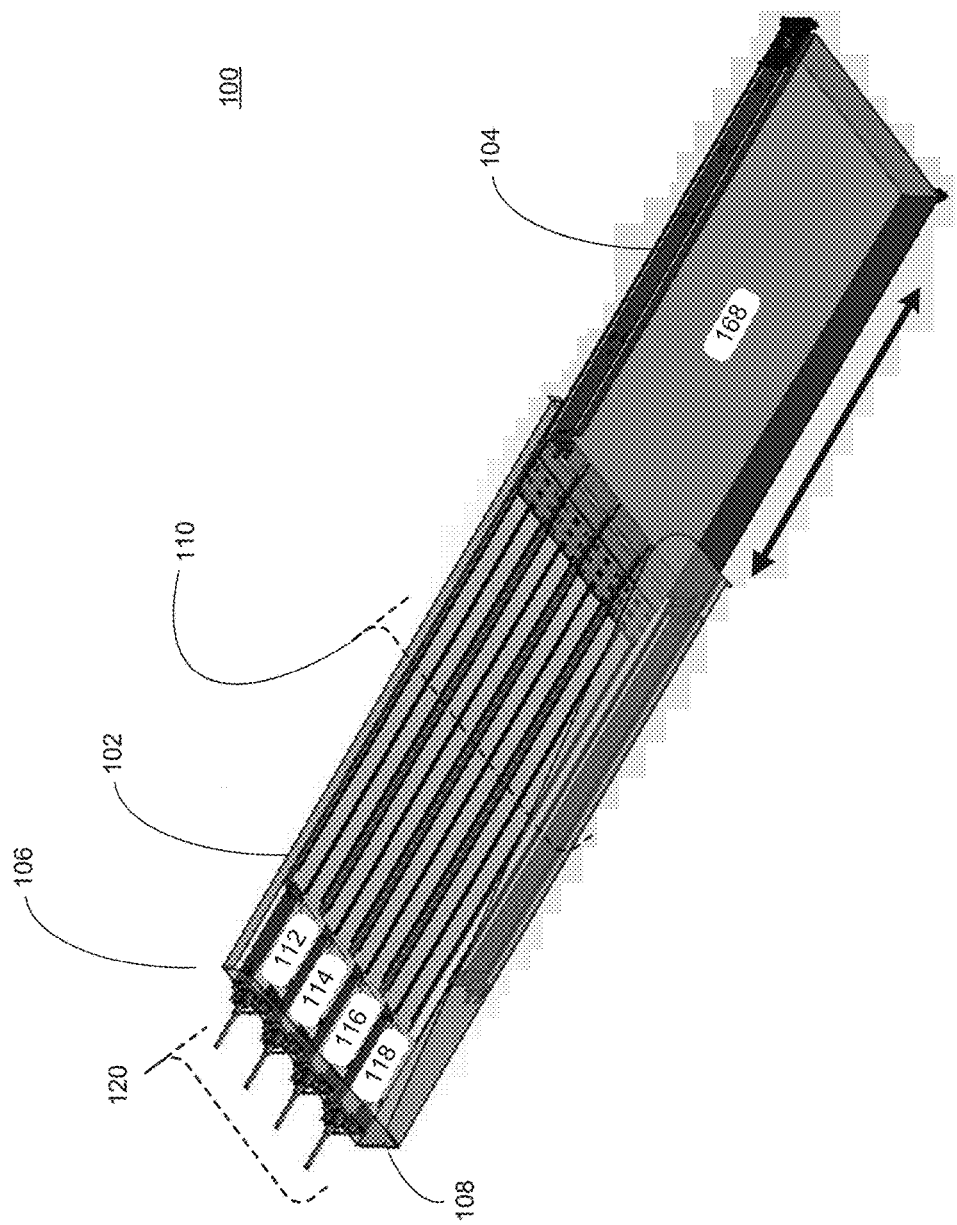
Figure 6:
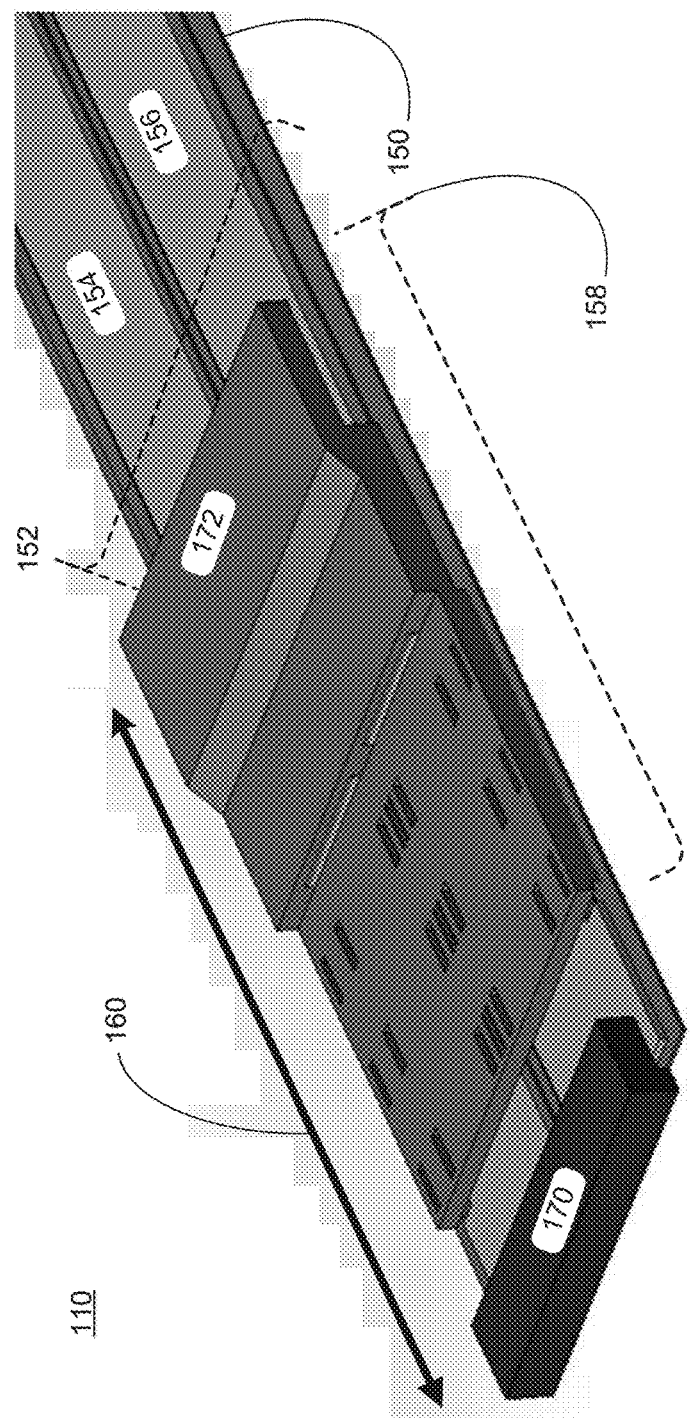
FIGS. 6-8 are diagrammatic views of a variable length conductor system for use with the rack-mountable, hyper-converged computing device of FIGS. 3-5 according to an aspect of this disclosure.

Referring also to FIGS. 4-6, rack-mountable, hyper-converged computing device 100 may be quite large and quite densely packed. Additionally, the enclosure of rack-mountable, hyper-converged computing device 100 may be configured in a drawer fashion, wherein rack-mountable, hyper-converged computing device 100 includes a fixed portion (e.g., fixed portion 102) that may be rigidly affixed to IT rack 10 and a slidable portion (e.g., slidable portion 104) that may be configured to slide forwards (like a drawer) out of the front of IT rack 10 and away from fixed portion 102.

Additionally, slidable portion 104 of rack-mountable, hyper-converged computing device 100 may be configured so that the sub-components (e.g., storage devices, compute modules, memory modules) included within rack-mountable, hyper-converged computing device 100 may all be accessible and serviceable through the exposed top of slidable portion 104 once slidable portion 104 is slid forward and is clear of fixed portion 102 (as there will typically be another IT device mounted directly on top of rack-mountable, hyper-converged computing device 100).

Power distribution unit 106 within rack-mountable, hyper-converged computing device 100 may be coupled to fixed portion 102 of rack-mountable, hyper-converged computing device 100 and may, therefore, not move with slidable portion 104 of rack-mountable, hyper-converged computing device 100. Accordingly, when rack-mountable, hyper-converged computing device 100 is in the extended/open position (as shown in FIG. 5), slidable portion 104 (and the various sub-components included therein) may move forward and away from power distribution unit 106/rear face 108 of rack-mountable, hyper-converged computing device 100. Conversely and when slidable portion 104 of rack-mountable, hyper-converged computing device 100 is pushed rearward into the closed position (as shown in FIG. 4), slidable portion 104 (and the various sub-components included therein) may move rearward and toward power distribution unit 106/rear face 108 of rack-mountable, hyper-converged computing device 100. As power distribution unit 106 is configured to provide electrical power to the various components included slidable portion 104, variable length conductor system 110 may be utilized to electrically couple power distribution unit 106 to slidable portion 104.

While for the following discussion, power distribution unit 106 is shown to include four discrete power supplies (e.g., power supplies 112, 114, 116, 118), this is for illustrative purposes only and is not intended to be a limitation of this disclosure, as other configurations are possible and are considered to be within the scope of this disclosure. For example, the number of discrete power supplies (e.g., power supplies 112, 114, 116, 118) included within power distribution unit 106 may be decreased to as few as one (if no level of high-availability is required of rack-mountable, hyper-converged computing device 100), or increased to as many as is required to provide the desired level of high availability for rack-mountable, hyper-converged computing device 100.

Regardless of the number of discrete power supplies included within power distribution unit 106, each of these discrete power supplies may be electrically-coupled to power source 120 (e.g., a line voltage source that provides power to rack-mountable, hyper-converged computing device 100).

Referring also to FIG. 6, variable length conductor system 110 may include bus bar assembly 150, wherein bus bar assembly 150 may include at least one bus bar conductor (e.g., bus bar conductor 152). For example, the at least one bus bar conductor (e.g., bus bar conductor 152) may include line voltage (+12 VDC for example) bus bar conductor 154 and neutral bus bar conductor 156. Since bus bar assembly 150 may be constructed of a flat stock material (as shown in FIG. 6), the overall height of bus bar assembly 150 may be considerably lower/smaller than traditional systems that may use e.g., bundled cables and/or pulley systems. Accordingly, a conductor system that utilizes bus bar assembly 150 (of variable length conductor system 110) may provide considerable space-saving advantages over traditional systems in high-density IT components where space is at a premium. At least a portion of the at least one bus bar conductor (e.g., bus bar conductor 152) included within bus bar assembly 150 may be plated with an oxidation-resistant material, examples of which may include but are not limited to hard gold plating.

Figure 7:
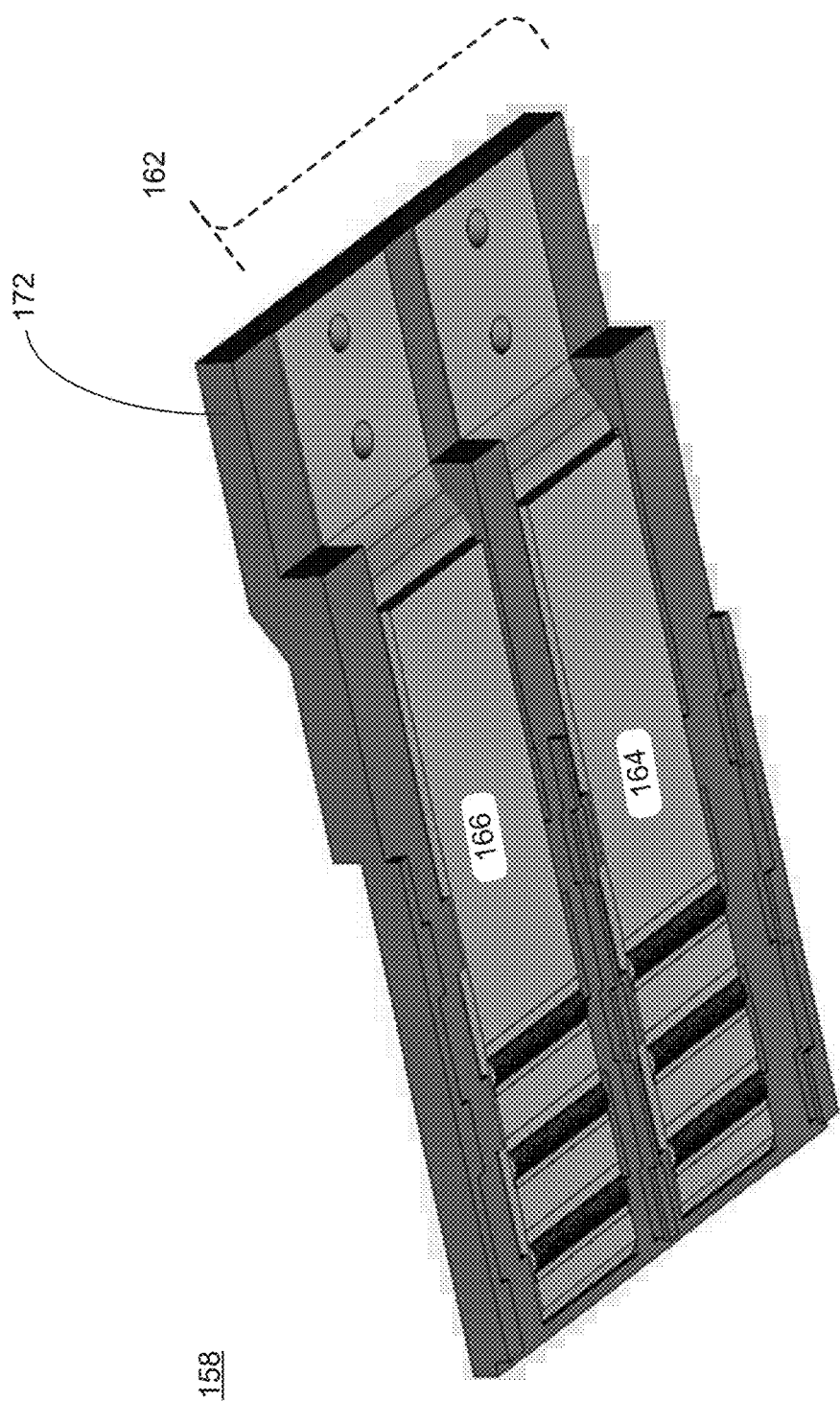

Variable length conductor system 110 may include sled assembly 158, wherein sled assembly 158 may be configured to be longitudinal-displaceable (in the direction of arrow 160) along bus bar assembly 150. Referring also to FIG. 7, sled assembly 158 may include at least one sled conductor 162 slidably electrically-coupled to the at least one bus bar conductor (e.g., bus bar conductor 152). For example, the at least one sled conductor (e.g., at least one sled conductor 162) may include line voltage sled conductor 164 and neutral sled conductor 166. At least a portion of the at least one sled conductor (e.g., at least one sled conductor 162) included within sled assembly 158 may be plated with an oxidation-resistant material, examples of which may include but are not limited to hard gold plating.

Line voltage sled conductor 164 may be slidably electrically-coupled to line voltage bus bar conductor 154, and neutral sled conductor 166 may be slidably electrically-coupled to neutral bus bar conductor 156; thus slidably electrically coupling system board 168 (and/or various subcomponents) to power distribution unit 106.

For example and in one implementation, bus bar assembly 150 may be affixed to fixed portion 102 of rack-mountable, hyper-converged computing device 100 and electrically coupled to power distribution unit 106; while sled assembly 158 may be affixed to slidable portion 104 of rack-mountable, hyper-converged computing device 100 and electrically coupled to system board 168 (and/or various subcomponents) included within rack-mountable, hyper-converged computing device 100.

Accordingly, connector assembly 170 of bus bar assembly 150 may be configured to: couple line voltage bus bar conductor 154 to a line voltage conductor (not shown) included within e.g., power supply 112; and couple neutral bus bar conductor 156 to a neutral voltage conductor (not shown) included within e.g., power supply 112. Further, connector assembly 172 of sled assembly 158 may be configured to: couple line voltage sled conductor 164 to a line voltage conductor (not shown) included within e.g., system board 168; and couple neutral sled conductor 166 to a neutral voltage conductor (not shown) included within e.g., system board 168.

Further and in another implementation, bus bar assembly 150 may be affixed to slidable portion 104 of rack-mountable, hyper-converged computing device 100 and electrically coupled to system board 168 (and/or various subcomponents) included within rack-mountable, hyper-converged computing device 100; while sled assembly 158 may be affixed to fixed portion 102 of rack-mountable, hyper-converged computing device 100 and electrically coupled to power distribution unit 106.

Accordingly, connector assembly 170 of bus bar assembly 150 may be configured to: couple line voltage bus bar conductor 154 to a line voltage conductor (not shown) included within e.g., system board 168; and couple neutral bus bar conductor 156 to a neutral voltage conductor (not shown) included within e.g., system board 168. Further, connector assembly 172 of sled assembly 158 may be configured to: couple line voltage sled conductor 164 to a line voltage conductor (not shown) included within e.g., power supply 112; and couple neutral sled conductor 166 to a neutral voltage conductor (not shown) included within e.g., power supply 112.

Figure 8:
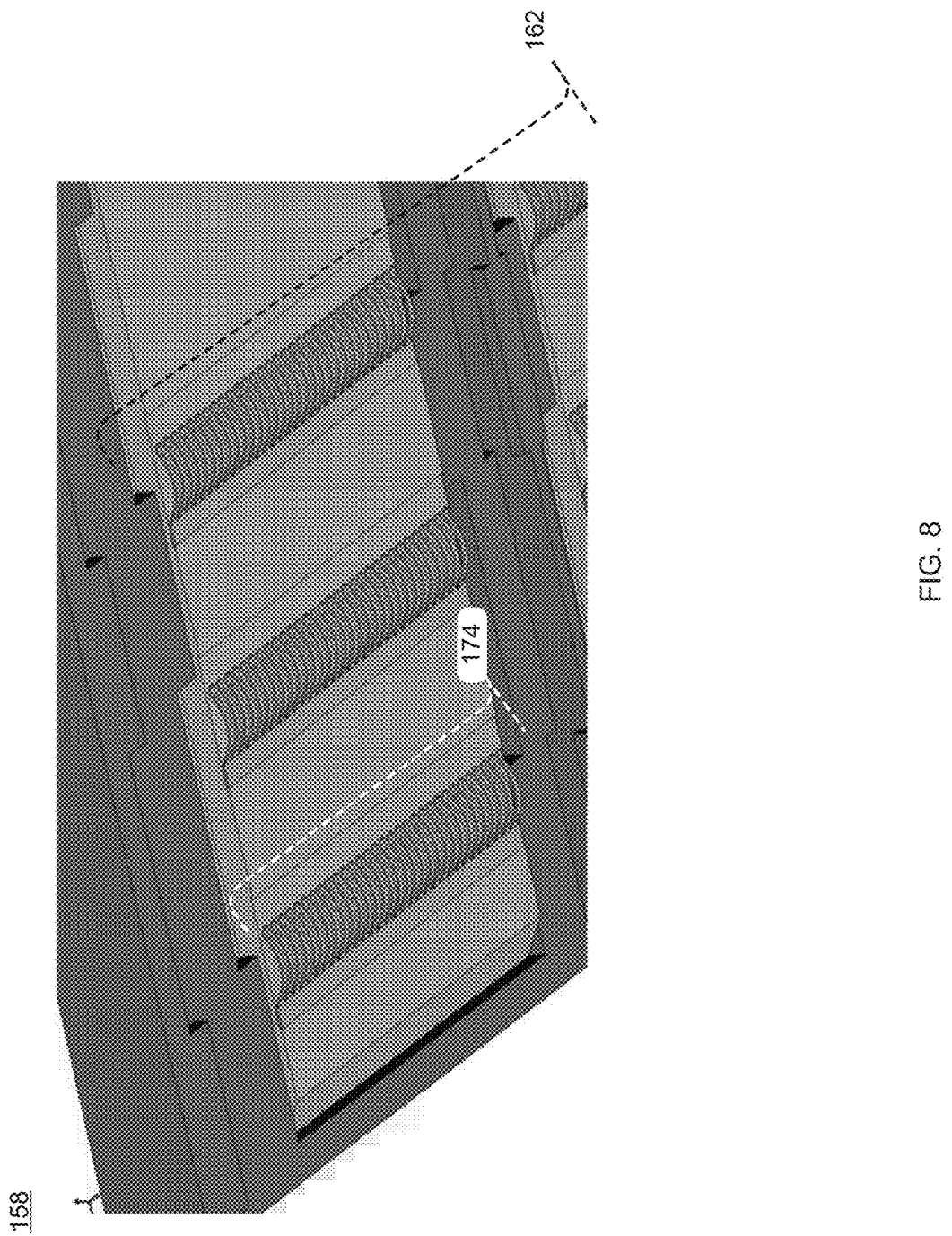

Referring also to FIG. 8, the at least one sled conductor (e.g., at least one sled conductor 162) included within sled assembly 158 may include at least one biasing element (e.g., biasing elements 174) configured to effectuate the slidable electrical coupling of the at least one sled conductor (e.g., at least one sled conductor 162) and the at least one bus bar conductor (e.g., bus bar conductor 152). For example, biasing elements 174 may include one or more of conductive loop assemblies that may be configured to be biased against (and make electrical contact with) the at least one bus bar conductor (e.g., bus bar conductor 152) included within bus bar assembly 150, wherein these conductive loop assembles may be constructed of a resilient conductive material that is electrically and rigidly coupled on one end to the at least one sled conductor (e.g., at least one sled conductor 162), while the other end of these conductive loop assembles may be allowed to slide with respect to the at least one sled conductor (e.g., at least one sled conductor 162), thus allowing for the deformation of these conductive loop assembles and the biasing of the same against the at least one bus bar conductor (e.g., bus bar conductor 152).

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A variable-length conductor assembly configured for use within an IT component, the variable-length conductor assembly comprising:
   a bus bar assembly including at least one bus bar conductor, the bus bar assembly configured to be affixed to a fixed portion of the IT component; and
   a sled assembly, configured to be longitudinal-displaceable along the bus bar assembly and electrically-coupled to a slidable portion of the IT component, the sled assembly including at least one sled conductor slidably electrically-coupled to the at least one bus bar conductor.

2. The variable-length conductor assembly of claim 1 wherein the at least one bus bar conductor includes:
   a line voltage bus bar conductor and a neutral bus bar conductor.

3. The variable-length conductor assembly of claim 1 wherein the at least one sled conductor includes:
   a line voltage sled conductor and a neutral sled conductor.

4. The variable-length conductor assembly of claim 1 wherein the bus bar assembly is configured to be electrically-coupled to a power distribution unit.

5. The variable-length conductor assembly of claim 4 wherein the power distribution unit includes:
   at least one discrete power supply.

6. The variable-length conductor assembly of claim 1 wherein the slidable portion of the IT component includes:
   a system board.

7. The variable-length conductor assembly of claim 1 wherein the IT component includes:
   a rack-mountable, hyper-converged computing device.

8. The variable-length conductor assembly of claim 1 wherein the variable-length conductor assembly is configured to provide electrical power to one or more sub-components included within the IT component.

9. The variable-length conductor assembly of claim 1 wherein at least a portion of the at least one bus bar conductor included within the bus bar assembly is plated with an oxidation-resistant material.

10. The variable-length conductor assembly of claim 1 wherein at least a portion of the at least one sled conductor included within the sled assembly is plated with an oxidation-resistant material.

11. The variable-length conductor assembly of claim 1 wherein the at least one sled conductor included within the sled assembly includes:
    at least one biasing element configured to effectuate the slidable electrical coupling of the at least one sled conductor and the at least one bus bar conductor.

12. A variable-length conductor assembly configured for use within an IT component, the variable-length conductor assembly comprising:
    a bus bar assembly including at least one bus bar conductor, wherein the at least one bus bar conductor includes a line voltage bus bar conductor and a neutral bus bar conductor, wherein the bus bar assembly is configured to be affixed to a fixed portion of the IT component; and
    a sled assembly, configured to be longitudinal-displaceable along the bus bar assembly and electrically-coupled to a slidable portion of the IT component, the sled assembly including at least one sled conductor slidably electrically-coupled to the at least one bus bar conductor, wherein the at least one sled conductor includes a line voltage sled conductor and a neutral sled conductor.

13. The variable-length conductor assembly of claim 12 wherein the bus bar assembly is configured to be electrically-coupled to a power distribution unit.

14. The variable-length conductor assembly of claim 13 wherein the power distribution unit includes:
    at least one discrete power supply.

15. The variable-length conductor assembly of claim 12 wherein the slidable portion of the IT component includes:
    a system board.

16. The variable-length conductor assembly of claim 12 wherein the IT component includes:
    a rack-mountable, hyper-converged computing device.

17. A variable-length conductor assembly configured for use within an IT component, the variable-length conductor assembly comprising:
    a bus bar assembly including at least one bus bar conductor, wherein the at least one bus bar conductor includes a line voltage bus bar conductor and a neutral bus bar conductor, wherein the bus bar assembly is configured to be affixed to a fixed portion of the IT component; and
    a sled assembly, configured to be longitudinal-displaceable along the bus bar assembly and electrically-coupled to a slidable portion of the IT component, the sled assembly including at least one sled conductor slidably electrically-coupled to the at least one bus bar conductor, wherein the at least one sled conductor includes a line voltage sled conductor and a neutral sled conductor;
    wherein the at least one sled conductor included within the sled assembly includes at least one biasing element configured to effectuate the slidable electrical coupling of the at least one sled conductor and the at least one bus bar conductor.

18. The variable-length conductor assembly of claim 17 wherein the IT component includes:
    a rack-mountable, hyper-converged computing device.

* * * * *